United States Patent
Cheon et al.

(10) Patent No.: US 11,742,222 B2
(45) Date of Patent: Aug. 29, 2023

(54) APPARATUS FOR REMOVING A PHOTORESIST AND APPARATUS FOR MANUFACTURING A COMICONDUCTOR DEVICE

(71) Applicant: Samsung Electronics Co., Ltd., Suwon-si (KR)

(72) Inventors: Jihun Cheon, Suwon-si (KR); Hyun Jung Lee, Suwon-si (KR); Pyojin Jeon, Suwon-si (KR); Yong-Jhin Cho, Suwon-si (KR); Wonjun Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/057,397

(22) Filed: Nov. 21, 2022

(65) Prior Publication Data

US 2023/0097611 A1    Mar. 30, 2023

Related U.S. Application Data

(62) Division of application No. 16/715,123, filed on Dec. 16, 2019, now Pat. No. 11,545,373.

(30) Foreign Application Priority Data

May 20, 2019 (KR) .................. 10-2019-0058816

(51) Int. Cl.
| | |
|---|---|
| H01L 21/67 | (2006.01) |
| B08B 7/00 | (2006.01) |
| B08B 3/02 | (2006.01) |
| B08B 7/04 | (2006.01) |
| G03F 7/30 | (2006.01) |
| B08B 5/02 | (2006.01) |

(52) U.S. Cl.
CPC ........ *H01L 21/67051* (2013.01); *B08B 3/024* (2013.01); *B08B 5/02* (2013.01); *B08B 7/0057* (2013.01); *B08B 7/04* (2013.01); *G03F 7/30* (2013.01); *B08B 2203/005* (2013.01)

(58) Field of Classification Search
CPC ............................................... H01L 21/67051
See application file for complete search history.

(56) References Cited

U.S. PATENT DOCUMENTS

| 6,143,477 A | 11/2000 | Rhieu |
| 9,597,703 B2 | 3/2017 | Detterbeck et al. |
| (Continued) | | |

FOREIGN PATENT DOCUMENTS

| JP | 2002-075945 A | 3/2002 |
| JP | 2004-241726 A | 8/2004 |
| KR | 10-1140376 B1 | 5/2012 |

OTHER PUBLICATIONS

Non-Final Office Action dated Jun. 30, 2022 in U.S. Appl. No. 16/715,123.

(Continued)

*Primary Examiner* — Jason Y Ko
(74) *Attorney, Agent, or Firm* — HARNESS, DICKEY & PIERCE, P.L.C.

(57) ABSTRACT

An apparatus for fabricating a semiconductor device may include a nozzle having a slit configured to eject solution and an ultraviolet emitter provided outside the nozzle. The ultraviolet emitter and the nozzle may be configured to move horizontally. The slit may be provided on a bottom surface of the nozzle.

19 Claims, 16 Drawing Sheets

(56) References Cited

U.S. PATENT DOCUMENTS

| | | |
|---|---|---|
| 2003/0192577 A1 | 10/2003 | Thakur et al. |
| 2006/0231125 A1 | 10/2006 | Yi |
| 2008/0092925 A1 | 4/2008 | Hong et al. |
| 2016/0240419 A1 | 8/2016 | Sieber et al. |

OTHER PUBLICATIONS

Notice of Allowance dated Oct. 4, 2022 in U.S. Appl. No. 16/715,123.

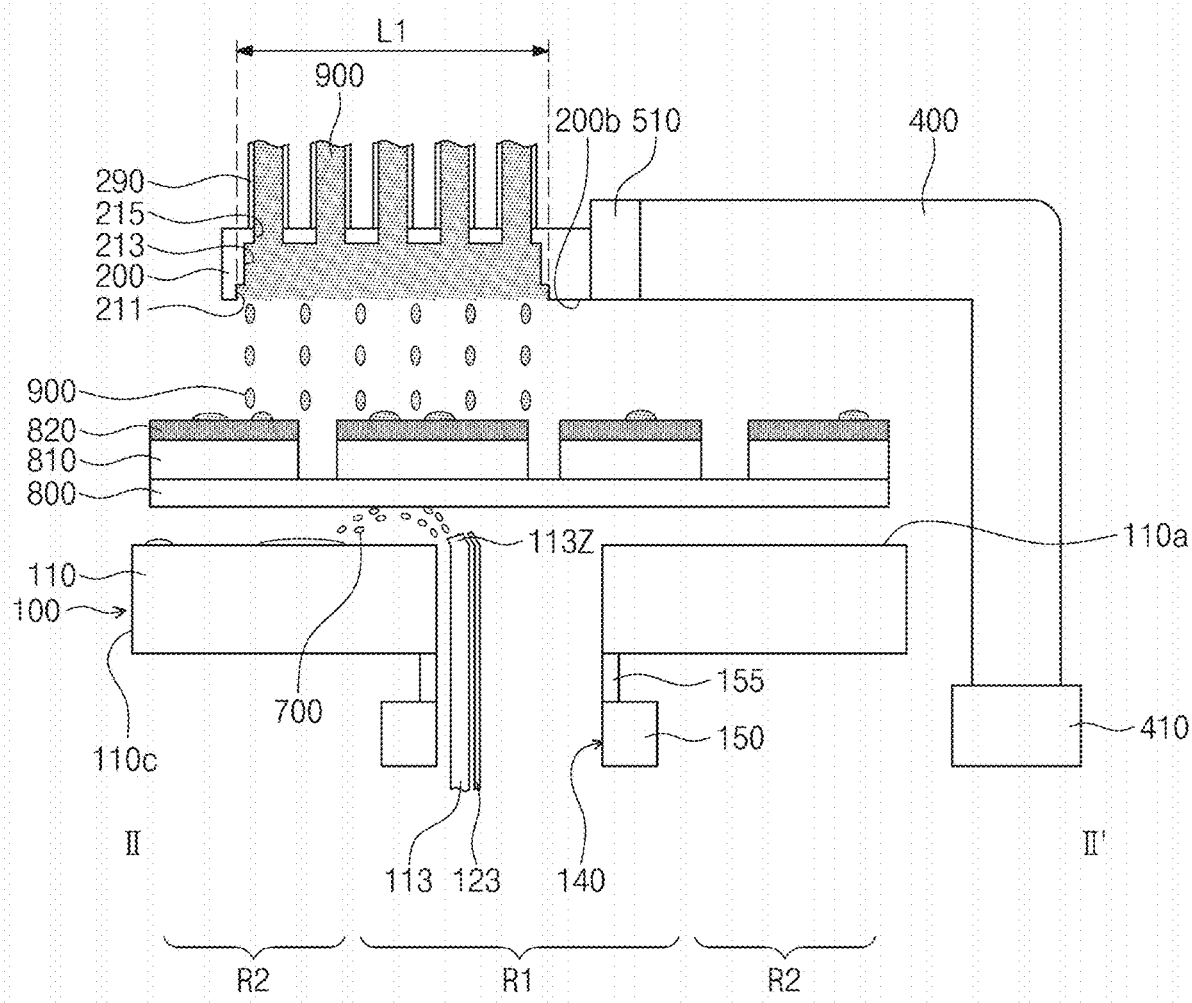

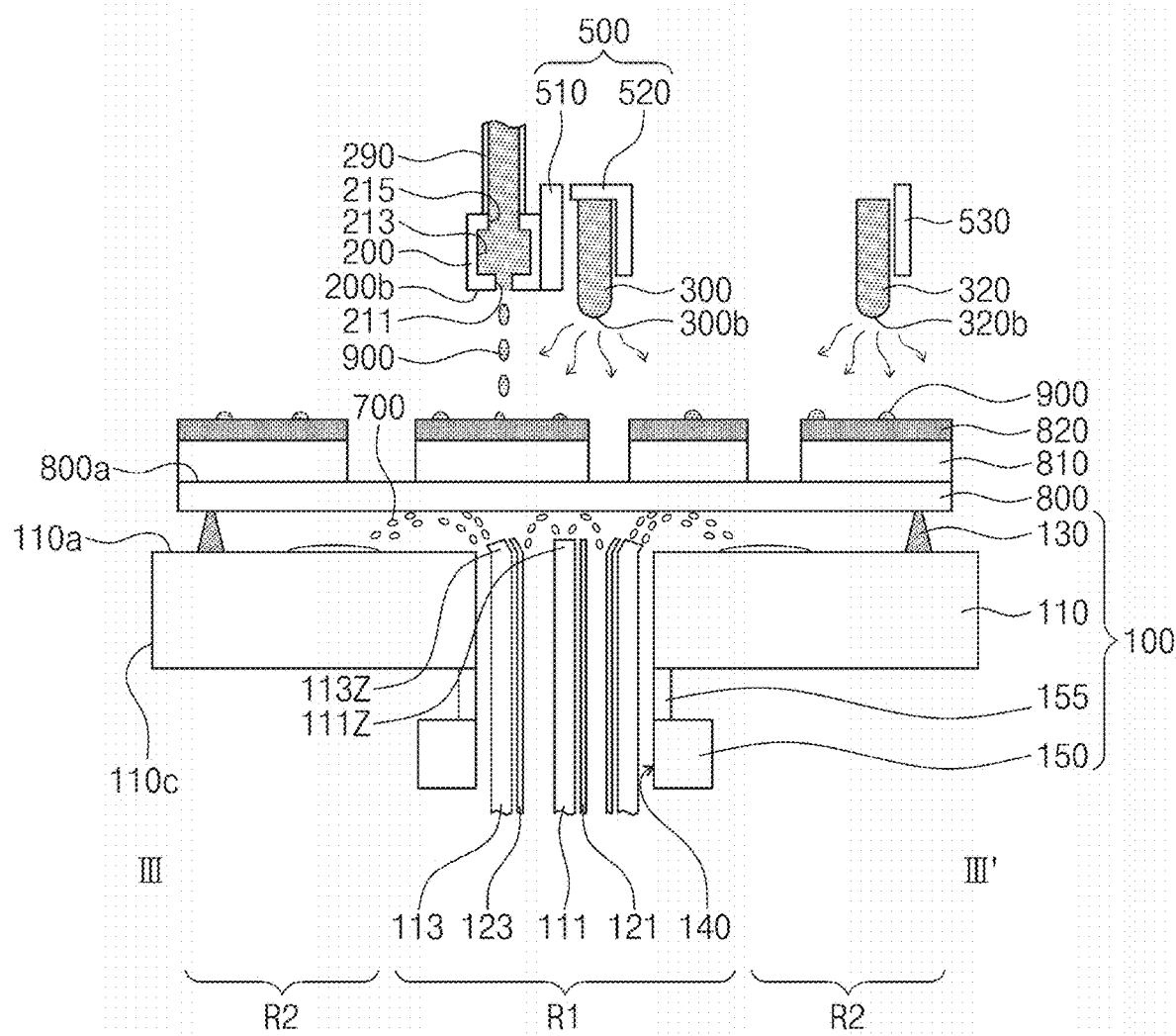

APPARATUS FOR REMOVING A PHOTORESIST AND APPARATUS FOR MANUFACTURING A COMICONDUCTOR DEVICE

CROSS-REFERENCE TO RELATED APPLICATIONS

This U.S. non-provisional patent application is a Divisional Application of U.S. application Ser. No. 16/715,123, filed on Dec. 16, 2019, which claims priority under 35 U.S.C. § 119 to Korean Patent Application No. 10-2019-0058816, filed on May 20, 2019, in the Korean Intellectual Property Office, the entire contents of which are hereby incorporated by reference.

BACKGROUND OF THE INVENTION

The present disclosure relates to an apparatus for fabricating a semiconductor device and a method of fabricating a semiconductor device using the same, and in particular, to an apparatus, which is used to remove a photoresist pattern, and a method of removing a photoresist pattern using the same.

In a process of fabricating a semiconductor device, a photolithography technology is widely used to perform a patterning process on a layer. If a process of patterning a layer using a photoresist pattern is finished, the photoresist pattern is removed. Since a semiconductor device is integrated on a large area substrate, a removal rate of the photoresist pattern on the substrate may vary from position to position. In the case where the photoresist pattern is removed using an acid material, such as sulfuric acid, waste water may be produced.

SUMMARY

Some embodiments of the inventive concepts provide a method of removing a photoresist pattern at a high removal rate and an apparatus for this removal process.

According to an embodiment of the inventive concepts, an apparatus for fabricating a semiconductor device may include a nozzle having a slit. The nozzle configured to eject a solution through the slit and an ultraviolet emitter provided outside the nozzle. The ultraviolet emitter and the nozzle may be configured to move horizontally. The slit may be provided on a bottom surface of the nozzle.

According to an embodiment of the inventive concepts, an apparatus for removing a photoresist may include an arm configured to perform a horizontal reciprocating motion, a nozzle coupled to the arm, and a ultraviolet emitter coupled to the arm and provided outside the nozzle. The nozzle may have a slit, which is provided in a bottom surface of the nozzle and is configured to eject solution.

According to an embodiment of the inventive concepts, an apparatus for fabricating a semiconductor device may include a nozzle having a slit, an ultraviolet emitter provided outside of the nozzle, a supporting plate, and a fluid supplying part provided in the supporting plate and configured to spray fluid on the top surface of the supporting plate. An outlet of the fluid supplying part may be exposed above a top surface of the supporting plate, and the bottom surface of the nozzle and the ultraviolet emitter may be spaced apart from a top surface of the supporting plate.

According to an embodiment of the inventive concepts, a method of fabricating a semiconductor device may include loading a substrate, on which a photoresist pattern is formed, on a supporting plate, and removing the photoresist pattern. The loading of the substrate may include disposing a nozzle having a slit and an ultraviolet emitter to be spaced apart from a top surface of the substrate. The removing of the photoresist pattern may include ejecting solution onto the photoresist pattern from the slit of the nozzle and irradiating ultraviolet light onto the ejected solution using the ultraviolet emitter. The ultraviolet emitter may perform a horizontal reciprocating motion, during the irradiating of the ultraviolet light.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 5A to 5C are diagrams illustrating a method of fabricating a semiconductor device, according to an embodiment of the inventive concepts.

FIG. 8B is a sectional view taken along a line of FIG. 8A.

It should be noted that these figures are intended to illustrate the general characteristics of methods, structures and/or materials utilized in certain example embodiments and to supplement the written description provided below.

These drawings are not to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

In the present specification, the same reference number will be used to refer to the same element. Hereinafter, an apparatus for fabricating a semiconductor device according to an embodiment of the inventive concepts and a method of fabricating a semiconductor device using the same will now be described with reference to the accompanying drawings.

Figure 1A:
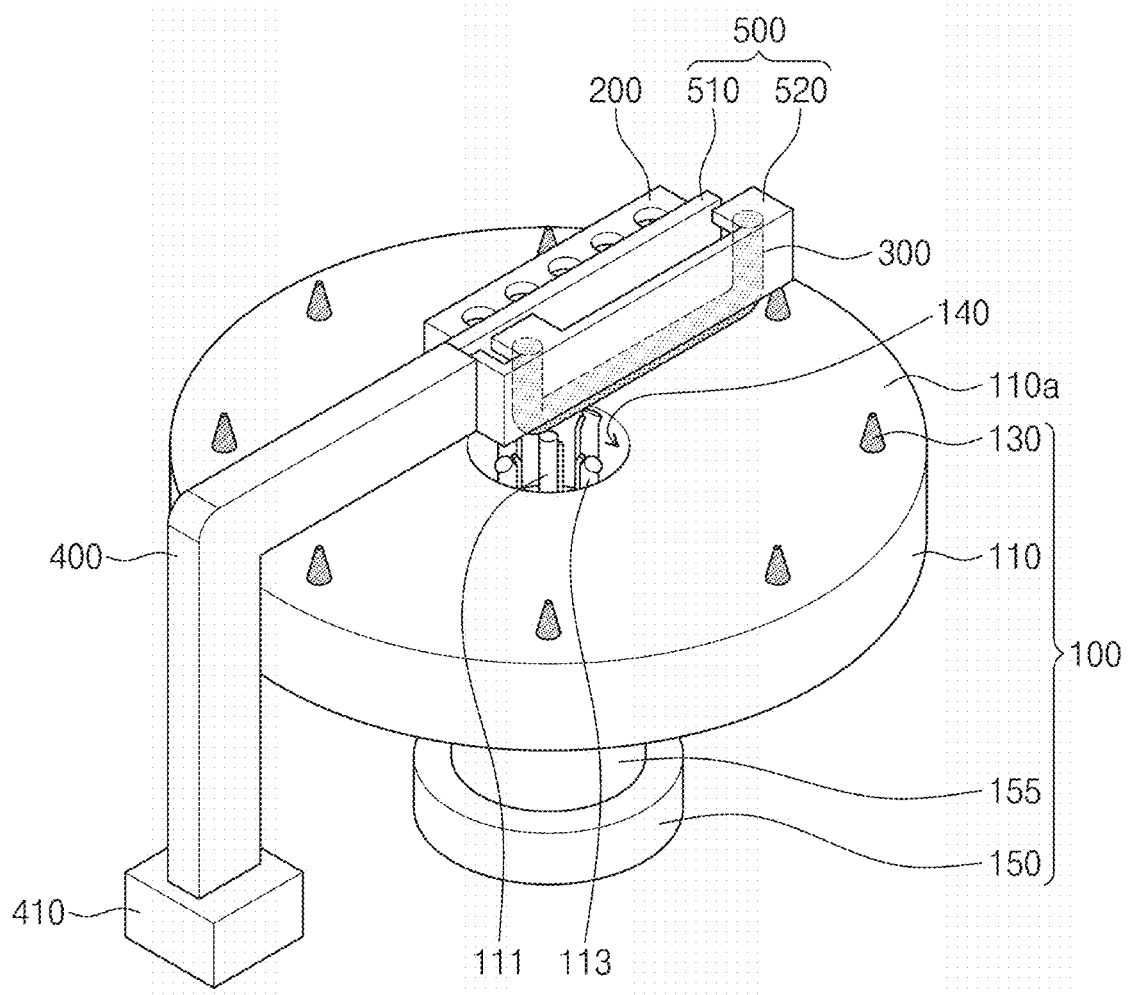
FIG. 1A is a perspective view illustrating an apparatus for fabricating a semiconductor device, according to an embodiment of the inventive concepts.
Figure 1B:
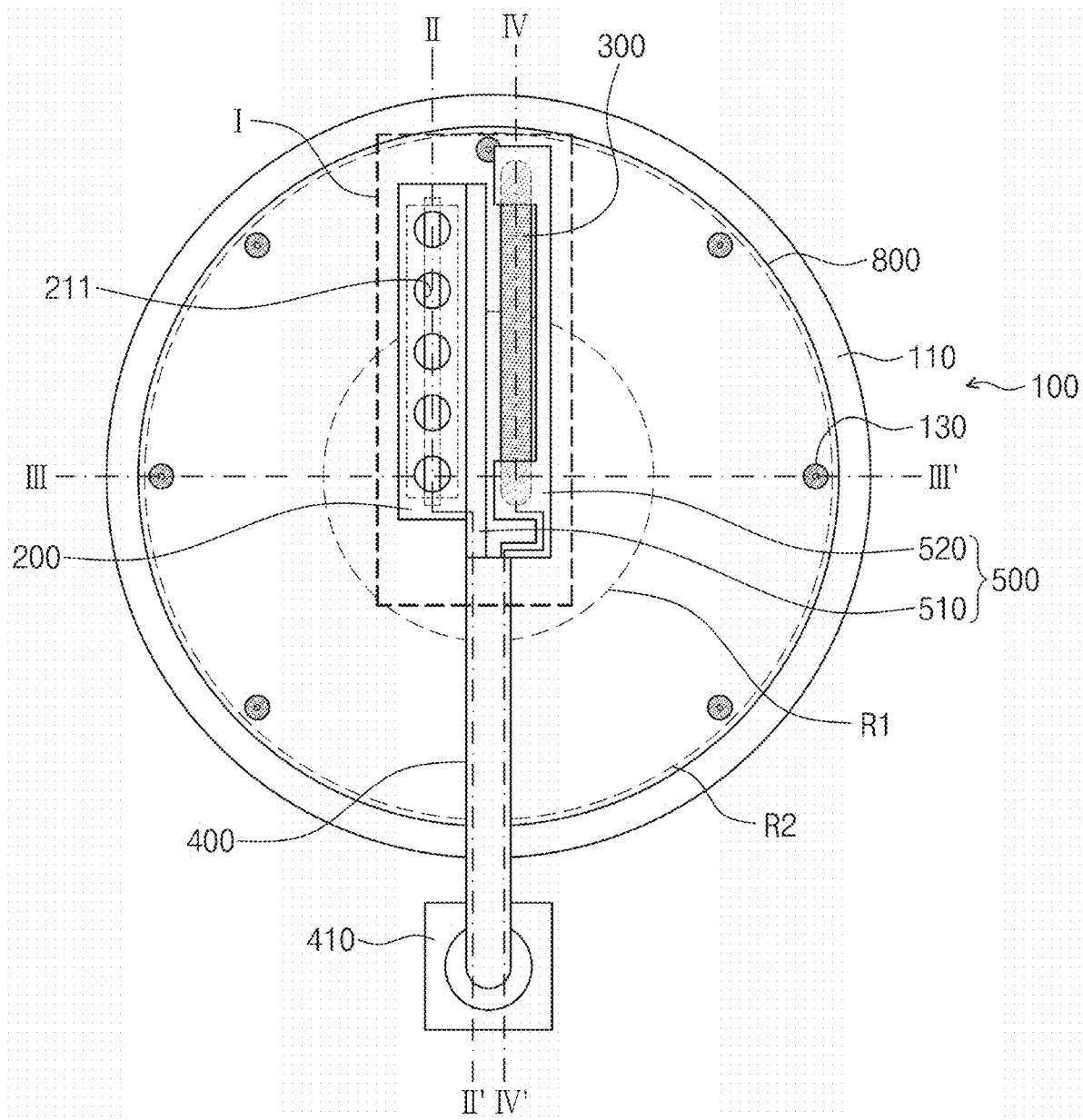
FIG. 1B is a plan view illustrating a substrate, which is loaded on an apparatus for fabricating a semiconductor device, according to an embodiment of the inventive concepts.
Figure 1C:
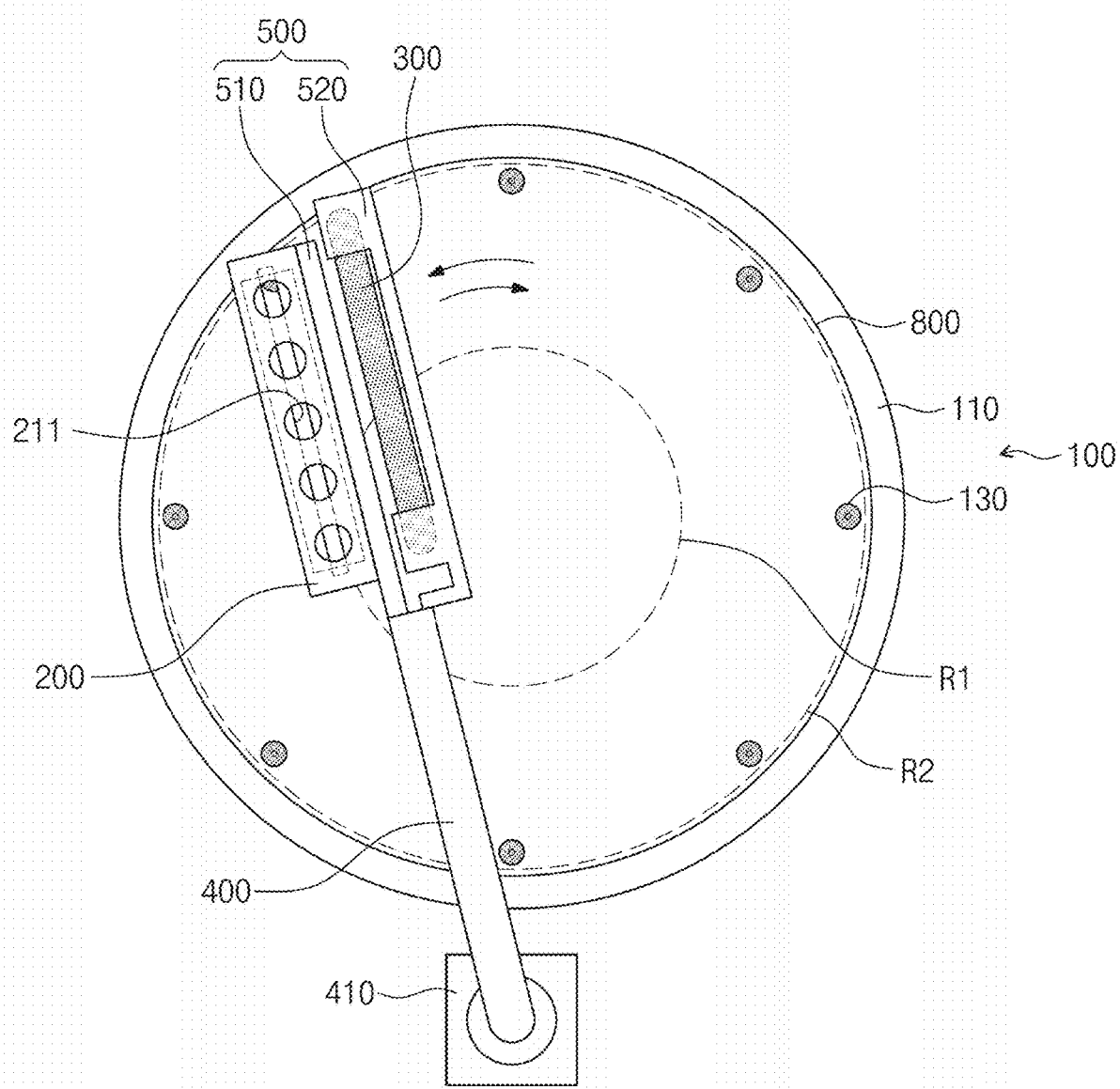
FIG. 1C is a diagram illustrating an operation of the apparatus for FIG. 1B, which is performed during a process of fabricating a semiconductor device.
Figure 2A:
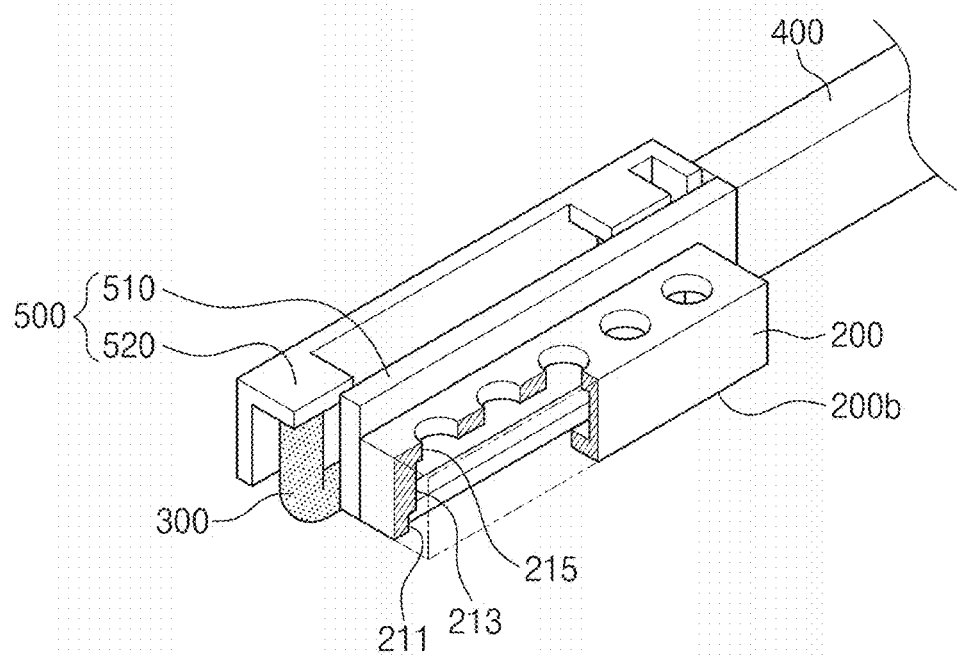
FIG. 2A is a perspective view illustrating a nozzle, an ultraviolet emitter, and an arm, according to an embodiment of the inventive concepts.
Figure 2B:
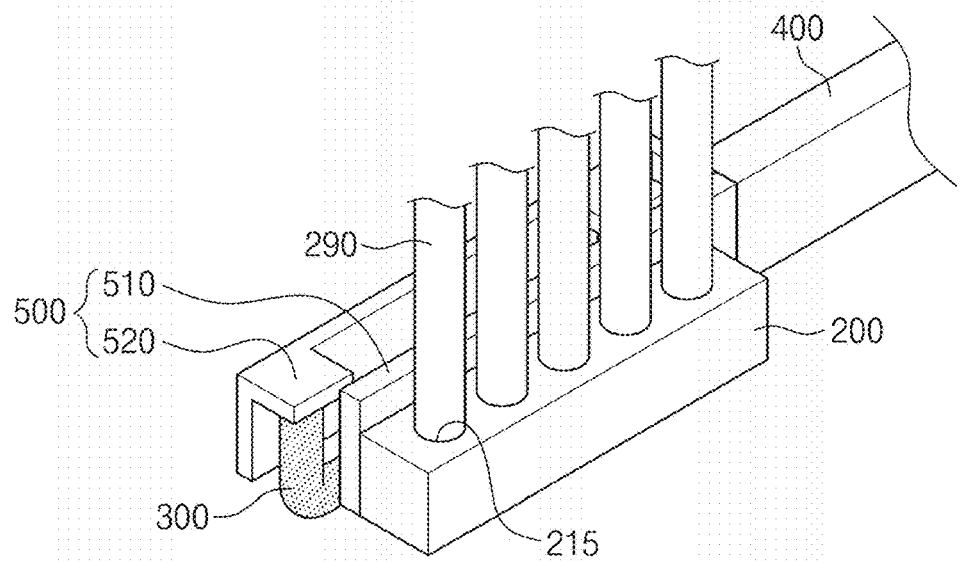
FIG. 2B is a perspective view illustrating a nozzle, to which a conduit is connected, according to an embodiment of the inventive concepts.

FIG. 1A is a perspective view illustrating an apparatus for fabricating a semiconductor device, according to an embodiment of the inventive concepts. FIG. 1B is a plan view illustrating a substrate, which is loaded on an apparatus for fabricating a semiconductor device, according to an embodiment of the inventive concepts. FIG. 1C is a diagram illustrating an operation of the apparatus for FIG. 1B, which is performed during a process of fabricating a semiconductor device. FIG. 2A is a perspective view illustrating a nozzle, an ultraviolet emitter, and an arm, according to an embodiment of the inventive concepts. FIG. 2B is a perspective view illustrating a nozzle, to which conduits are connected, according to an embodiment of the inventive concepts.

Referring to FIGS. 1A, 1B, 1C, 2A, and 2B, an apparatus for fabricating a semiconductor device may include a supporting unit 100, a nozzle 200, an ultraviolet emitter 300, and an arm 400. The fabrication apparatus may further include a connecting portion 500, and the connecting portion 500 may include a first connecting portion 510 and a second connecting portion 520. Preparing the fabrication apparatus may include preparing the supporting unit 100, preparing the arm 400, to which the nozzle 200 and the ultraviolet emitter 300 of FIG. 2A are coupled, and connecting conduits 290 to the nozzle 200, as shown in FIG. 2B.

The fabrication apparatus may be used to remove an organic material, such as a photoresist material. As an example, the fabrication apparatus may be an apparatus for removing a photoresist. Hereinafter, a technology of removing a photoresist pattern using the fabrication apparatus will be described, but the use of the fabrication apparatus according to an embodiment of the inventive concepts is not limited to this purpose.

The supporting unit 100 may include a supporting plate 110, supporting pins 130, a rotation driver 150, and a supporting rod 155. As shown in FIGS. 1B and 1C, the supporting plate 110 may be configured to support a substrate 800. In other words, the substrate 800 may be loaded on the supporting plate 110. The substrate 800 may be a semiconductor wafer. The substrate 800 may have a center region R1 and an edge region R2, when viewed in a plan view. The edge region R2 of the substrate 800 may enclose the center region R1. The edge region R2 of the substrate 800 may be closer to a side surface of the substrate 800 than the center region R1. The supporting plate 110 may have a center region and an edge region, when viewed in a plan view. The center region R1 of the substrate 800 may correspond to the center region of the supporting plate 110, and the edge region R2 of the substrate 800 may be provided on the edge region of the supporting plate 110. For example, the edge region of the supporting plate 110 may surround the center region. The edge region of the supporting plate 110 may be closer to an outer sidewall of the supporting plate 110 than the center region.

The supporting pins 130 may be disposed on a top surface 110a of the supporting plate 110. The supporting pins 130 may be provided on the edge region of the supporting plate 110. The supporting pins 130 may be spaced apart from each other. The substrate 800 may be disposed on and fastened to the supporting pins 130. The supporting pins 130 may include an insulating material, but the inventive concepts is not limited to this example.

The rotation driver 150 may be provided on a bottom surface of the supporting plate 110. The rotation driver 150 may include, for example, a motor. The rotation driver 150 may be connected to the supporting plate 110 through the supporting rod 155. During an operation of the fabrication apparatus, the supporting plate 110 may be configured to rotate about a rotating axis (not shown) using a driving force provided from the rotation driver 150. The rotating axis may be perpendicular to the top surface 110a of the supporting plate 110. As the supporting plate 110 rotates, the substrate 800 may rotate along with the supporting plate 110.

As shown in FIG. 1A, an internal hole 140 may be provided to penetrate the rotation driver 150, the supporting rod 155, and the supporting plate 110. The internal hole 140 may be provided at the center region of the supporting plate 110. A first fluid supplying part 111 (e.g., a spout, tube, pump, pipe, shoot, duct, pipette, etc.) and a second fluid supplying part 113 may be provided in the internal hole 140. The internal hole 140 may serve as a pathway, through which the first fluid supplying part 111 and the second fluid supplying part 113 pass. A portion of the first fluid supplying part 111 and a portion of the second fluid supplying part 113 may be exposed above the top surface 110a of the supporting plate 110. The first fluid supplying part 111 and the second fluid supplying part 113 may be used to supply a fluid onto the top surface 110a of the supporting plate 110.

An arm driver 410 may be disposed near a side portion of the supporting unit 100. The arm driver 410 may include a motor. The arm 400 may be connected to the arm driver 410 and may be spaced apart from the supporting unit 100. The arm 400 may include a portion that is disposed on and vertically spaced apart from the top surface 110a of the supporting plate 110. The arm 400 may be horizontally moved over a top surface of the substrate 800 by the driving force of the arm driver 410, as shown in FIGS. 1B and 1C. For example, the arm 400 may be configured to perform a horizontal motion about the arm driver 410 serving as a center axis. The horizontal motion of the arm 400 may be a reciprocating or rotary motion. In the present specification, the expression "the horizontal motion of an object on the top surface of the substrate 800" means that the object is moved in a direction parallel to the top surface of the substrate 800 while being spaced apart from the top surface of the substrate 800, and/or that the object moves horizontally over the top surface 110a of the supporting plate 110. The top surface 110a of the supporting plate 110 may be substantially parallel to the top surface of the substrate 800.

As an example, in the case where the supporting plate 110 is fixed, the arm 400 may perform a horizontal reciprocating motion between a first edge position and a second edge position. The center region of the supporting plate 110 may be disposed between the first edge position and a second edge position. The first edge position may correspond to a side portion of the edge region, which is located near the center region of the supporting plate 110, and the second edge position may correspond to another side portion of the edge region, which is located near/around the center region R1. In certain embodiments, the arm 400 may perform a horizontal reciprocating motion between the first edge position and a center position above the center region of the supporting plate 110 when observed in a plan view, but may not be moved to the second edge position. Hereinafter, the nozzle 200, the ultraviolet emitter 300, the arm 400, and the connecting portion 500 will be described in more detail below.

Figure 3A:
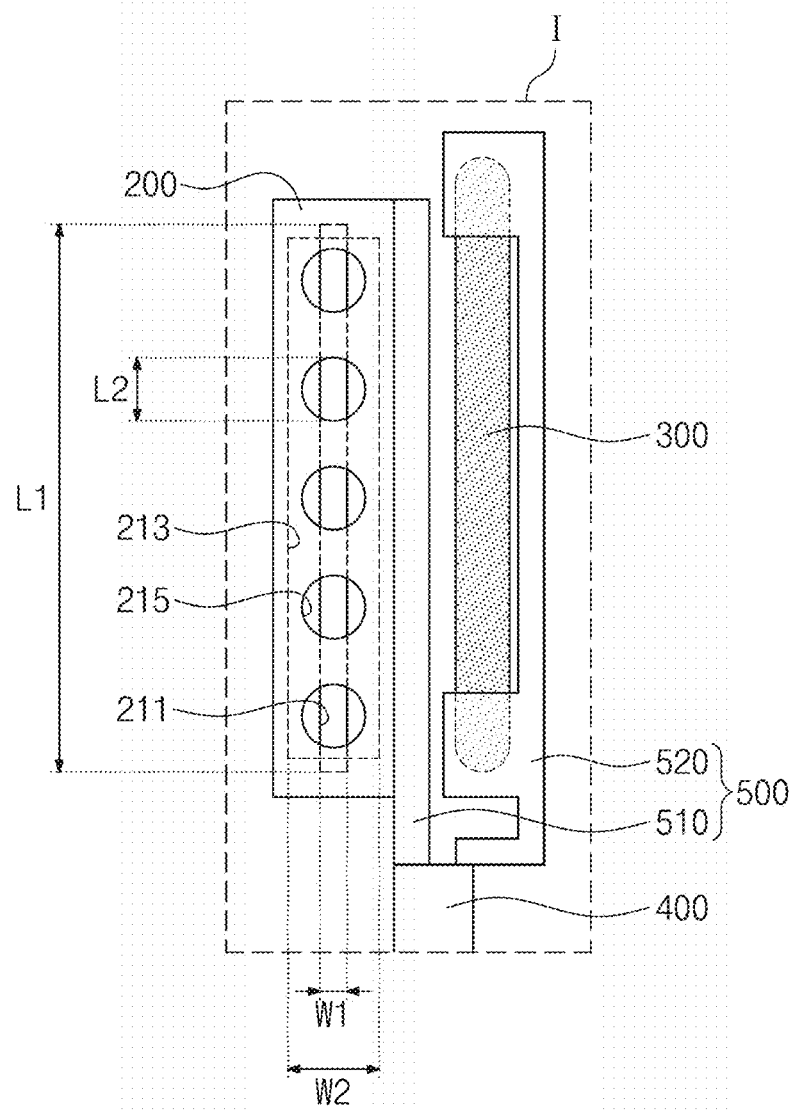
FIG. 3A is an enlarged plan view of a region 'I' of FIG. 1B and illustrates a nozzle and an ultraviolet emitter, according to an embodiment of the inventive concepts.

FIG. 3A is an enlarged plan view of a region T of FIG. 1B and illustrates a nozzle and an ultraviolet emitter, according to an embodiment of the inventive concepts.

Referring to FIGS. 1A, 1B, 1C, 2A, 2B, and 3A, the nozzle 200 may have an injection hole 215, a dispenser room 213, and a slit 211. As shown in FIG. 2A, the injection hole 215 may be provided in an upper portion of the nozzle 200. The injection hole 215 may penetrate a top surface of the nozzle 200. The top surface of the nozzle 200 may be opposite to a bottom surface 200b. In an embodiment, a plurality of the injection holes 215 may be provided. The injection holes 215 may be spaced apart from each other, when viewed in a plan view. As shown in FIG. 2B, the conduits 290 may be connected to or received in the injection holes 215, respectively. The conduits 290 may supply solution into the injection holes 215. The solution may contain ozone and water. The solution may be used to remove a photoresist material.

The dispenser room 213 may be provided in the nozzle 200 and may be connected to a plurality of the injection holes 215. Solution supplied from the conduits 290 may be provided to the dispenser room 213 through the injection holes 215. The slit 211 may be provided on the bottom surface 200b of the nozzle 200. Here, the slit 211 may be connected to the dispenser room 213 and may be configured to eject the solution.

In some embodiments, since the solution is provided to the slit 211 through a plurality of the injection holes 215 spaced apart from each other, the solution may be uniformly ejected from the entire region of the slit 211.

The nozzle 200 may include quartz. The quartz may have a strong corrosion-resistant property to ozone. Thus, even when the solution contains ozone, the nozzle 200 may not be corroded. When the solution passes through the slit 211, a relatively high pressure may be exerted on the nozzle 200. Since the quartz has high hardness, the nozzle 200 may be prevented from being damaged by the ejection pressure of the solution, during the operation of the fabrication apparatus.

As shown in FIG. 3A, a length of the nozzle 200 may be greater than a width of the nozzle 200. A length L1 of the slit 211 may be greater than a width W1 of the slit 211. For example, the length L1 of the slit 211 may range from 10 mm to 160 mm, and the width W1 of the slit 211 may range from 0.1 mm to 10 mm. The length L1 of the slit 211 may be greater than a length L2 of each of the injection holes 215. The width W1 of the slit 211 may be smaller than a width W2 of each of the injection holes 215. The length L2 of each of the injection holes 215 may be substantially equal to the width W2 of a corresponding one of the injection holes 215. The length of the nozzle 200, the length L1 of the slit 211, and the lengths L2 of the injection holes 215 may be values, which are measured in a direction of a longitudinal axis of the arm 400, when viewed in a plan view. A width of an element may be a value, which is measured in a direction perpendicular to its length, when viewed in a plan view.

As shown in FIG. 2A, the nozzle 200 may be coupled to the arm 400 through the first connecting portion 510. The first connecting portion 510 may be provided between the nozzle 200 and the arm 400 and may be coupled to the nozzle 200 and the arm 400. The first connecting portion 510 may include, for example, a bracket. In the present specification, an expression "a first element is connected/coupled to a second element" may means that the first element is directly connected/coupled to the second element or is indirectly connected/coupled to the second element through other element.

The nozzle 200 may be configured such that it can be horizontally moved along with the arm 400. For example, the nozzle 200 may be configured to perform a horizontal reciprocating motion between a first region, which is overlapped with the center region of the supporting plate 110 as shown in FIG. 1B, and a second region, which is overlapped with the edge region of the supporting plate 110 as shown in FIG. 1C. Thus, the nozzle 200 may eject the solution onto the top surfaces of the center and edge regions R1 and R2 of the substrate 800. The ejecting/supplying of the solution onto the top surface of the substrate 800 may include ejecting/supplying the solution onto elements (e.g., a photoresist pattern 820 to be described below) formed the top surface of the substrate 800.

The ultraviolet emitter 300 may be provided on the top surface 110a of the supporting plate 110, as shown in FIG. 1A, and may be spaced apart from the top surface 110a of the supporting plate 110. The ultraviolet emitter 300 may be provided outside the nozzle 200. The ultraviolet emitter 300 may include a light source, such as an ultraviolet lamp. The ultraviolet emitter 300 may have a "U"-shaped section. However, the shape of the ultraviolet emitter 300 is not limited to this example and may be variously changed. As an example, the ultraviolet emitter 300 may have a cylindrical or bar shape. The second connecting portion 520 may be provided between the ultraviolet emitter 300 and the arm 400 and may be coupled to the ultraviolet emitter 300 and the arm 400. The ultraviolet emitter 300 may be connected to the arm 400 through the second connecting portion 520. The second connecting portion 520 may include, for example, a bracket.

As shown in FIGS. 1B and 1C, the ultraviolet emitter 300 may be configured such that it can be horizontally moved along with the arm 400 and the nozzle 200. For example, the ultraviolet emitter 300 may be configured to perform a horizontal reciprocating motion between a first position and a second position, when viewed in a plan view. Here, when viewed in a plan view, the first position may be a position, at which at least a portion of the ultraviolet emitter 300 is overlapped with the center region of the supporting plate 110, as shown in FIG. 1B, and the second position may be closer to the edge region of the supporting plate 110 than the first position, as shown in FIG. 1C. Accordingly, the ultraviolet emitter 300 may irradiate the ultraviolet light onto the top surfaces of the center and edge regions R1 and R2 of the substrate 800. Here, the ultraviolet emitter 300 may be configured to further irradiate the ultraviolet light onto a top surface of a region between the center and edge regions R1 and R2 of the substrate 800. The ultraviolet light may have a wavelength ranging from 10 nm to 400 nm. In an embodiment, the ultraviolet light may have a wavelength ranging from 10 nm to 280 nm. The irradiating of the ultraviolet light onto the top surface of the substrate 800 may include irradiating the ultraviolet light onto elements (e.g., a photoresist pattern 820 to be described below) formed on the top surface of the substrate 800.

Figure 3B:
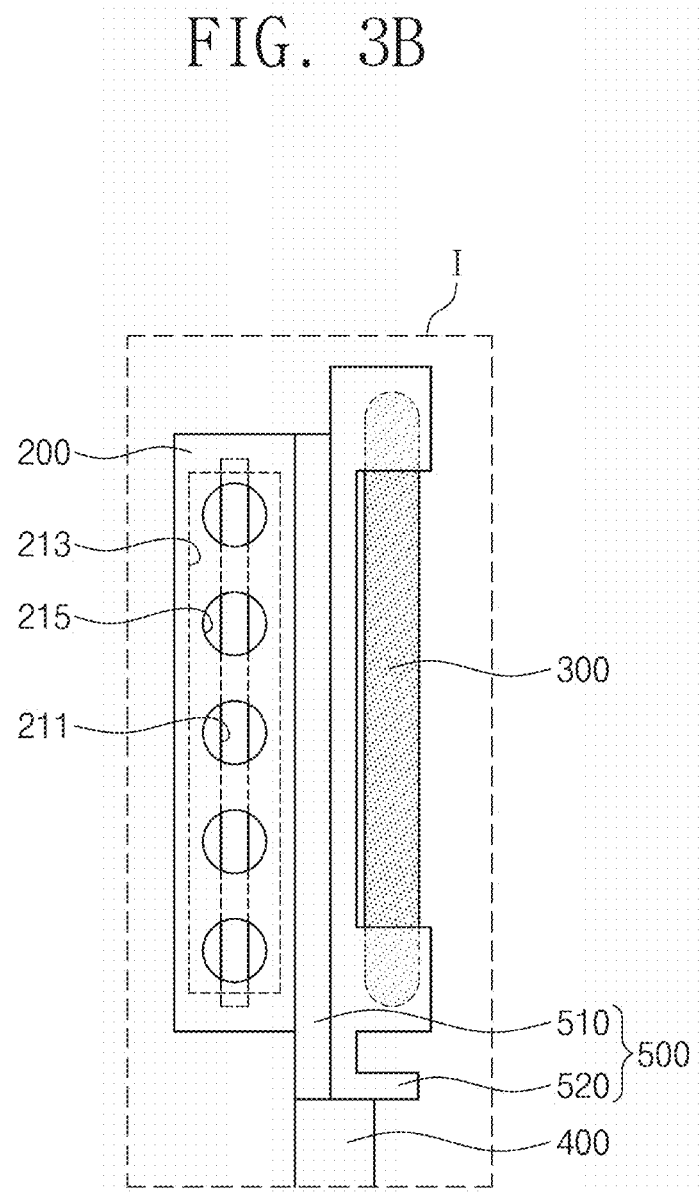
FIG. 3B is a plan view illustrating a connecting portion according to an embodiment of the inventive concepts.

FIG. 3B is a plan view illustrating a connecting portion according to an embodiment of the inventive concepts and corresponds to an enlarge plan view of the region 'I' of FIG. 1B. For concise description, a previously described element may be identified by the same reference number without repeating an overlapping description thereof.

Referring to FIG. 3B, the second connecting portion 520 may be disposed adjacent to the first connecting portion 510. For example, each of the first and second connecting portions 510 and 520 may be disposed between the nozzle 200 and the first ultraviolet emitter 300.

The first connecting portion 510 and the second connecting portion 520 may be provided to constitute a single object. For example, a single bracket structure may be used as the connecting portion 500, and the connecting portion 500 may be coupled to the nozzle 200, the ultraviolet emitter 300, and the arm 400. In this case, a portion of the bracket structure may be referred to as the first connecting portion 510, and another portion of the bracket structure may be referred to as the second connecting portion 520. The first connecting portion 510 and the second connecting portion 520 may be connected to each other without any interface there between. The nozzle 200, the ultraviolet emitter 300, and the arm 400 may be configured to have substantially the same features as those described above.

Figure 3C:
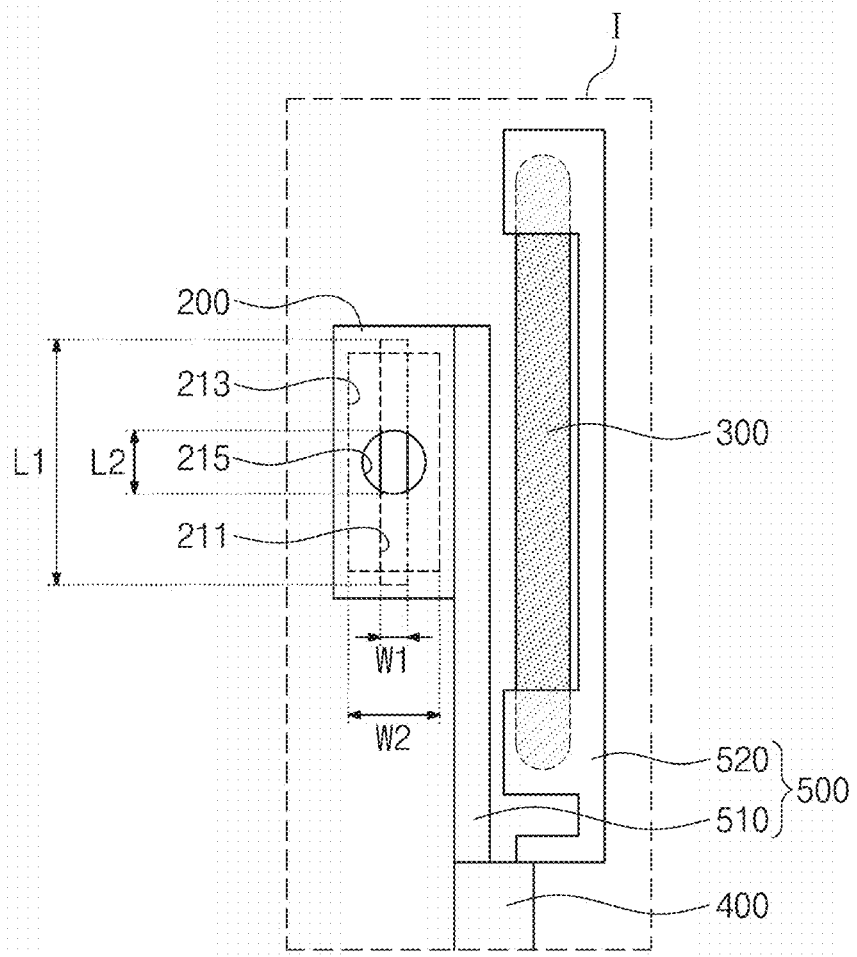
FIG. 3C is a plan view illustrating a nozzle according to an embodiment of the inventive concepts.

FIG. 3C is a plan view illustrating a nozzle according to an embodiment of the inventive concepts and corresponds to an enlarge plan view of the region 'I' of FIG. 1B. For concise description, a previously described element may be identified by the same reference number without repeating an overlapping description thereof.

Referring to FIG. 3C, the nozzle 200 may have the injection hole 215, the dispenser room 213, and the slit 211. In an embodiment, unlike the structure shown in FIG. 3A, the slit 211 may have a relatively small length L1, and the nozzle 200 may be configured to have a single injection hole 215. The length L1 of the slit 211 may be greater than the width W1. A length L2 of the injection hole 215 may be substantially equal to a width W2 of the injection hole 215. The length L1 of the slit 211 may be greater than the length L2 of the injection hole 215. The width W1 of the slit 211 may be smaller than the width W2 of the injection hole 215. The number of the injection hole 215 may not be limited to FIGS. 3A to 3C and may be variously changed depending on the length L1 of the slit 211. For convenience in illustration and description, the nozzle 200 will be supposed to have a plurality of the injection holes 215, in all figures, except FIG. 3C.

Hereinafter, a method of fabricating a semiconductor device, using the apparatus according to an embodiment of the inventive concepts, will be described in more detail below.

Figure 4:
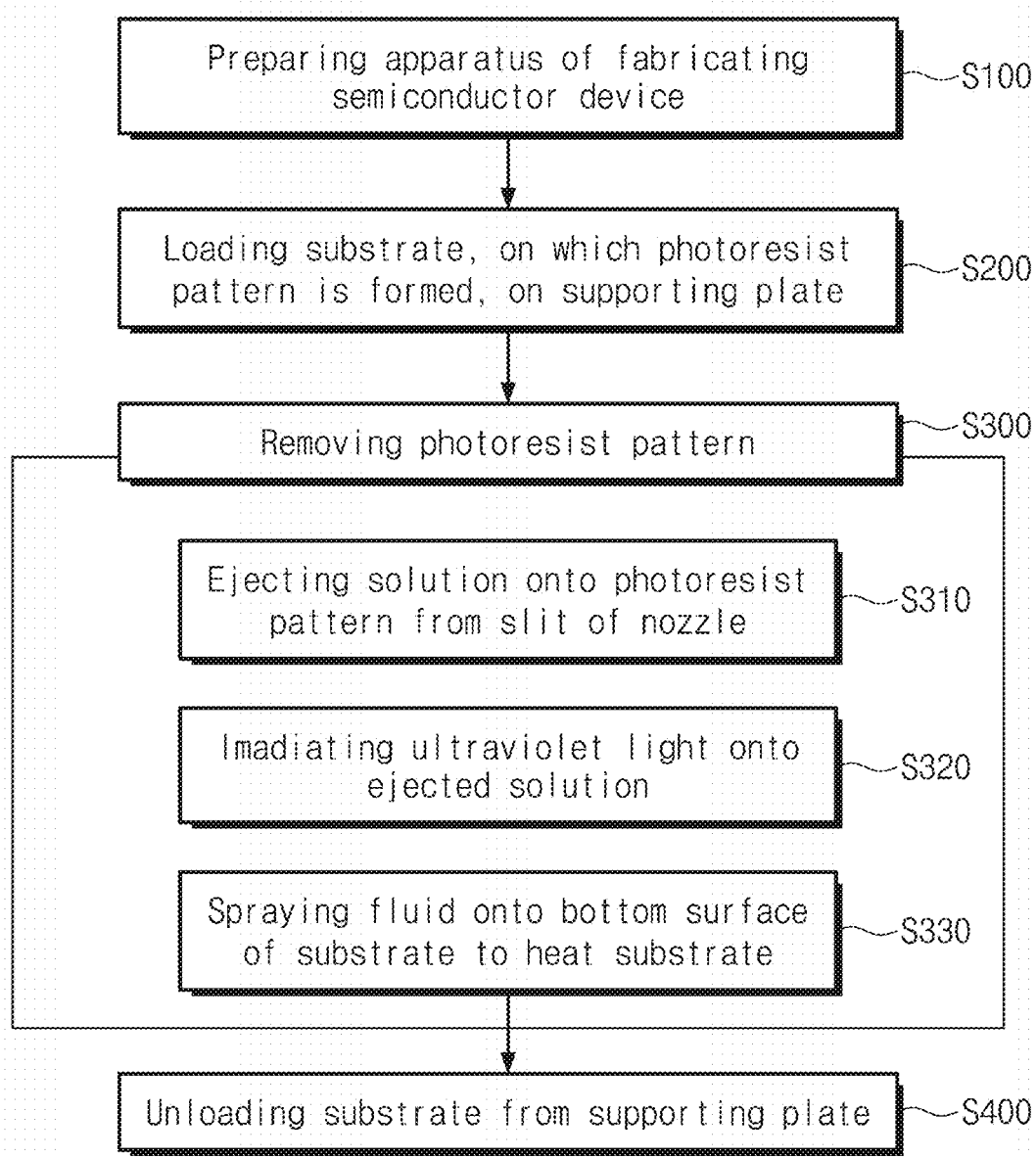
FIG. 4 is a flow chart illustrating a method of fabricating a semiconductor device, according to an embodiment of the inventive concepts.
Figure 5A:
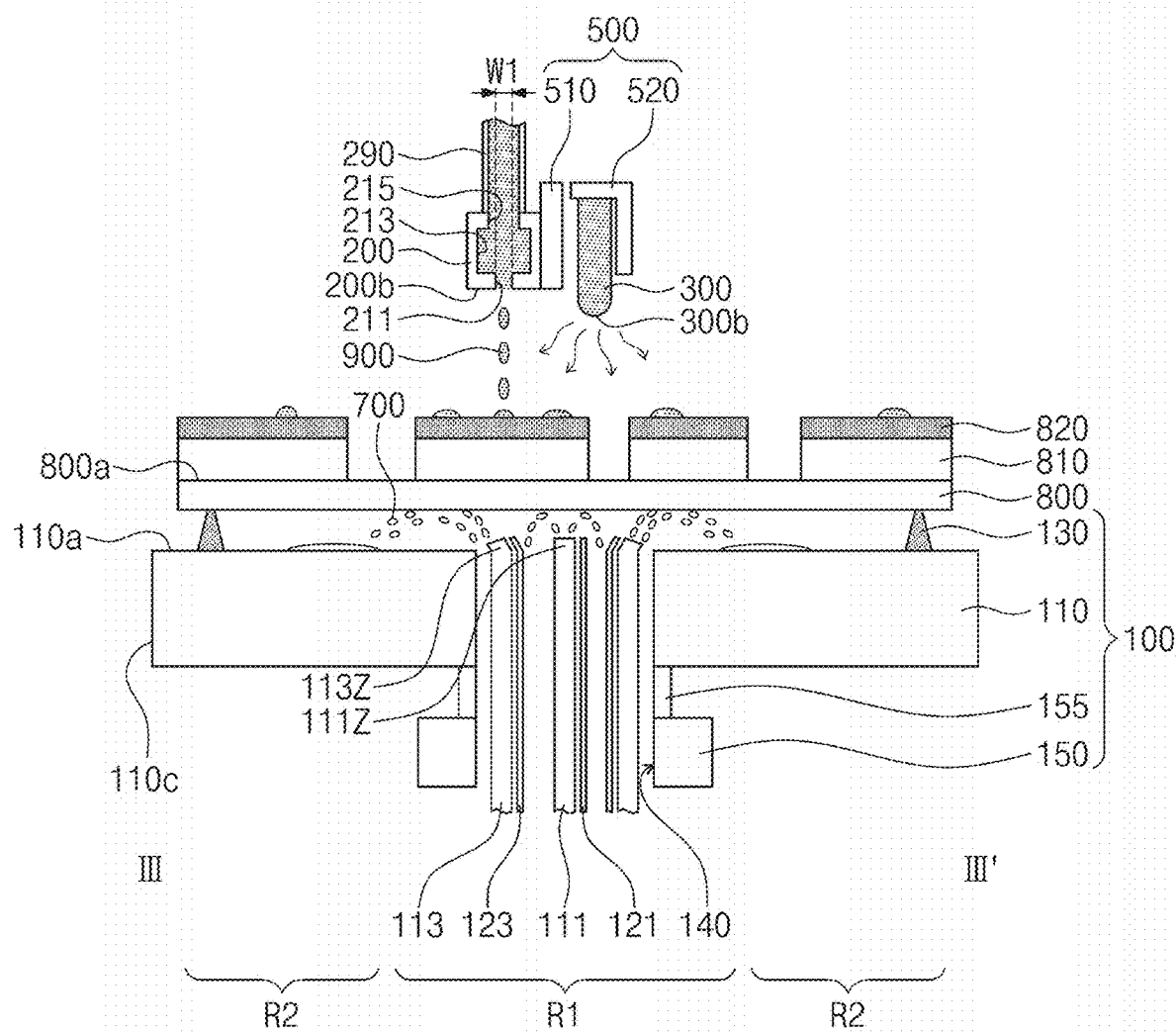
Figure 5C:
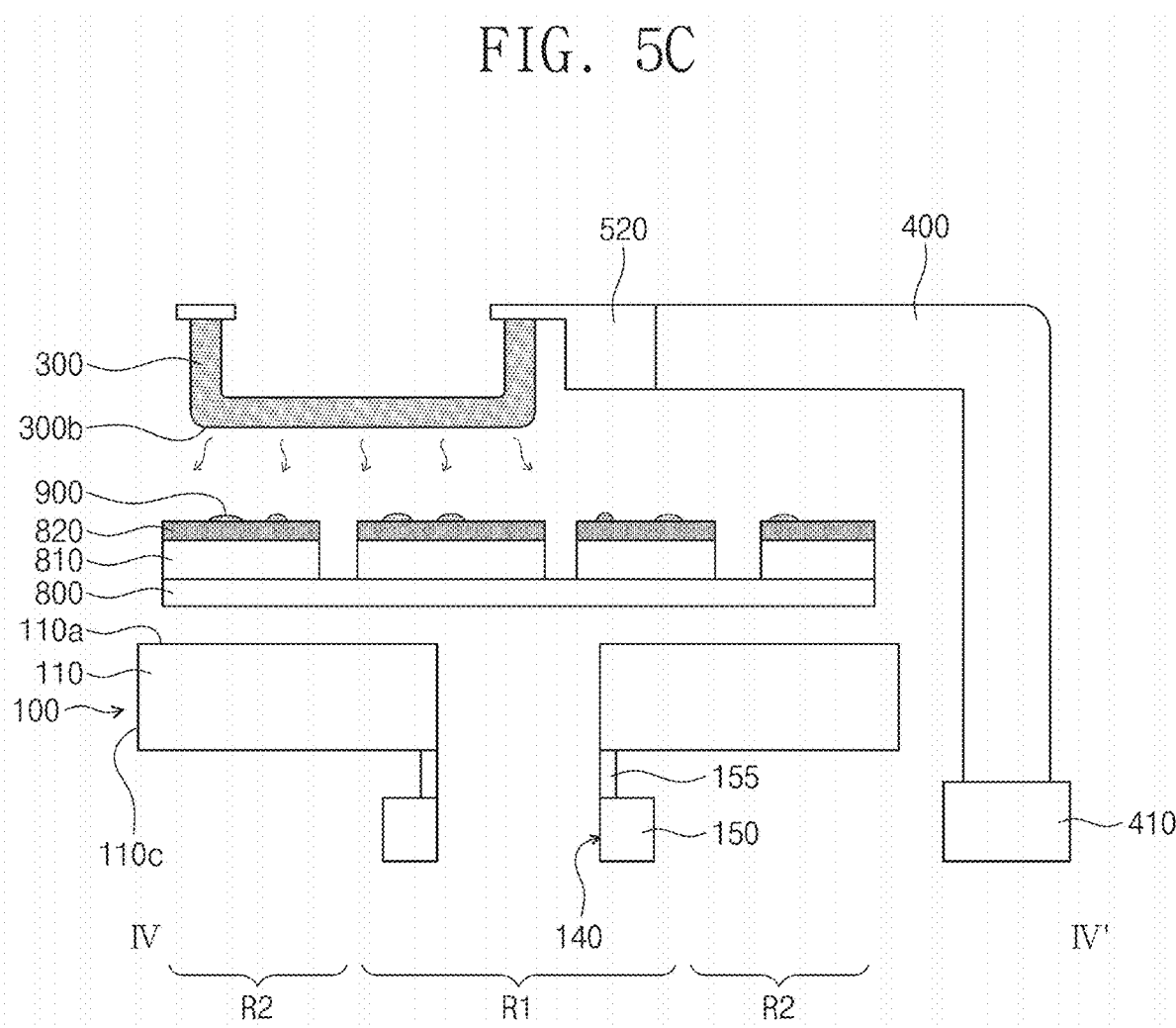

FIG. 4 is a flow chart illustrating a method of fabricating a semiconductor device, according to an embodiment of the inventive concepts. FIGS. 5A to 5C are diagrams illustrating a method of fabricating a semiconductor device (in particular, a photoresist removal process), according to an embodiment of the inventive concepts. For example, FIGS. 5A, 5B, and 5C are sectional views, which are respectively taken along lines and IV-IV' of FIG. 1B. The following description will be partly given, based on FIGS. 1A, 1B, 1C, 2A, 2B, and 3A.

Referring to FIGS. 4, 5A, 5B, and 5C, a method of fabricating a semiconductor device may include a process of removing the photoresist pattern 820 using the fabrication apparatus. The method of fabricating a semiconductor device may include preparing the fabrication apparatus (in S100), loading the substrate 800, on which the photoresist pattern 820 is formed, on the supporting plate 110 (in S200), removing the photoresist pattern 820 (in S300), and unloading the substrate 800 (in S400).

As described above, the preparing of the fabrication apparatus (in S100) may include preparing the supporting unit 100, preparing the arm 400, to which the nozzle 200 and the ultraviolet emitter 300 of FIG. 2A are coupled, and connecting the conduits 290 to the nozzle 200, as shown in FIG. 2B. The substrate 800 may be loaded on the supporting plate 110 (in S200). The substrate 800 may be a substrate, on which a lower layer 810 and the photoresist pattern 820 are formed. The lower layer 810 and the photoresist pattern 820 may be stacked on a top surface 800a of the substrate 800. Although not shown, at least one layer may be interposed between the substrate 800 and the lower layer 810. The lower layer 810 may be a layer, which is patterned using the photoresist pattern 820. The photoresist pattern 820 may be a layer containing an organic material, and the organic material may have carbon-carbon bonds.

The loading of the substrate 800 on the supporting plate 110 (in S200) may further include disposing the nozzle 200 and the ultraviolet emitter 300 to be spaced apart from the top surface 800a of the substrate 800.

The removal of the photoresist pattern 820 (in S300) may include ejecting a solution 900 from the slit 211 of the nozzle 200 onto the substrate 800 (in S310), irradiating an ultraviolet light onto the ejected solution 900 (in S320), and spraying a fluid 700 onto a bottom surface of the substrate 800 to heat the substrate 800 (in S330). The ejecting of the solution 900 onto the substrate 800 (in S310), the irradiating of the ultraviolet light onto the ejected solution 900 (in S320), and the heating of the substrate 800 (in S330) may be performed after the loading of the substrate 800 (in S200).

The nozzle 200 may supply the solution 900 onto the top surface 800a of the substrate 800. In other words, the solution 900 from the slit 211 of the nozzle 200 may be ejected onto the substrate 800 (in S310). The solution 900 may contain water, in which ozone is dissolved. Due to its chemical instability, the ozone may produce radicals. The radicals may exhibit high reactivity and may cut covalent bonds in a material constituting the photoresist pattern 820, as written in the following reaction formula 1. For example, the radicals may be used to cut the carbon-carbon bonds of the photoresist pattern 820. Thus, the photoresist pattern 820 may be removed.

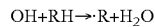

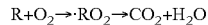 [Reaction Formula 1]

In the reaction formula 1, RH may be an organic material constituting the photoresist pattern 820. R may include a substituted or unsubstituted hydrocarbon having 1 to 100,000,000 carbon atoms. The radicals may not react with the lower layer 810 or may have a very low reactivity to the lower layer 810. Thus, the lower layer 810 may remain, when the removal process of the photoresist pattern 820 is finished.

In the case where an acidic material is used to remove the photoresist pattern 820, waste water may be produced. The acidic material may include sulfuric acid. In some embodiments, radicals, which are left during the removal process of the photoresist pattern 820, may be reacted with each other and may disappear spontaneously. In this case, it may be possible to prevent or suppress the waste water from being produced through the removal process of the photoresist pattern 820.

In the case where the slit 211 and the dispenser room 213 are omitted and the solution 900 is directly ejected from the injection hole 215 of the nozzle 200, the solution 900 may be concentrated onto a specific region (e.g., the center region R1) of the substrate 800. A removal rate of the photoresist pattern 820 may vary depending on a position of the photoresist pattern 820. For example, the removal rate of the photoresist pattern 820 on the edge region R2 of the substrate 800 may be slower than the removal rate of the photoresist pattern 820 on the center region R1 of the substrate 800. In this case, the photoresist pattern 820 may remain on the edge region R2 of the substrate 800, after the removal process of the photoresist pattern 820.

In some embodiments, the solution 900 may be ejected from the slit 211 of the nozzle 200, and, as shown in FIG. 5B, the slit 211 may have a relatively long length L1. The slit 211 may be overlapped with the center and edge regions R1 and R2 of the substrate 800. The solution 900 may be supplied onto the photoresist pattern 820 on the center region R1 of the substrate 800 and onto the photoresist pattern 820 on the edge region R2. The removal rate of the photoresist pattern 820 on the edge region R2 of the substrate 800 may be equal or similar to the removal rate of the photoresist pattern 820 on the center region R1 of the substrate 800.

In the case where the length L1 of the slit 211 is smaller than 10 mm, the solution 900 may be ejected with an excessively high pressure. Under this high pressure condition, the radicals may be reacted to each other and thereby may be spontaneously decomposed. The ejected solution 900 may have a low content ratio of radicals. Thus, the removal rate of the photoresist pattern 820 may be reduced. In the case where the length L1 of the slit 211 is greater than 160 nm, a portion of the slit 211 may be located over the outside of the substrate 800, during the horizontal motion of the nozzle 200 of FIGS. 1B and 1C. The solution 900 may be ejected to the outside of the substrate 800, and this may lead to a reduction in process efficiency of the process. In some embodiments, the slit 211 may have the length L1 ranging from 10 mm to 160 nm, and in this case, the photoresist pattern 820 may be efficiently removed at a high removal rate.

In the case where the width W1 of the slit 211 is smaller than 0.1 mm (as shown in FIG. 5A), the solution 900 may be ejected with an excessively high pressure. In the case where the width W1 of the slit 211 is greater than 1 mm, the solution 900 may be ejected with an excessively low pressure and may lead to a reduction in process efficiency of the process. In some embodiments, the slit 211 may have the width W1 ranging from 0.1 mm to 1 mm.

In some embodiments, as shown in FIG. 5B, at least one of the injection holes 215 may be overlapped with the edge region R2 of the substrate 800, and at least another of the injection holes 215 may be overlapped with the center region R1 of the substrate 800. Since the solution 900 is transferred to the slit 211 through a plurality of the injection holes 215 spaced apart from each other, the solution 900 may be uniformly ejected from the entire region of the slit 211, even when the slit 211 has a long length L1. For example, the solution 900 may be ejected from the entire region of the slit 211 with substantially the same pressure. Thus, the removal rate of the photoresist pattern 820 on the edge region R2 of the substrate 800 may become more similar to the removal rate of the photoresist pattern 820 on the center region R1 of the substrate 800.

In the removal process of the photoresist pattern 820, the substrate 800 may be rotated along with the supporting plate 110. Due to the rotation of the substrate 800, the solution 900 may be uniformly distributed on the center and edge regions R1 and R2 of the substrate 800.

As shown in FIGS. 1B, 1C, and 5B, during the removal process of the photoresist pattern 820, the nozzle 200 may be horizontally moved over the top surface 800a of the substrate 800 by the arm 400. Thus, the solution 900 may be ejected onto the top surfaces 800a of the center and edge regions R1 and R2 of the substrate 800 in a dispersed manner. This may make it possible to reduce a difference in removal rate between the photoresist pattern 820 on the edge region R2 of the substrate 800 and the photoresist pattern 820 on the center region R1 of the substrate 800.

A light-emitting surface 300b of the ultraviolet emitter 300 may include bottom and side surfaces of the ultraviolet emitter 300. As shown in FIG. 5A, the light-emitting surface 300b of the ultraviolet emitter 300 may be directed toward a gap region between the top surface 800a of the substrate 800 and the bottom surface 200b of the nozzle 200. The ultraviolet emitter 300 may irradiate an ultraviolet light onto the ejected solution 900 (S220). For example, the ultraviolet emitter 300 may irradiate the ultraviolet light onto the ejected solution 900, during the solution 900 ejected from the slit 211 of the nozzle 200 travels toward the photoresist pattern 820. Under the irradiation of the ultraviolet light, ozone may expedite the production of radicals, as written by the following reaction formula 2. Thus, the photoresist pattern 820 may be removed more quickly and more easily. In the reaction formula 2, hv means the ultraviolet light.

[Reaction Formula 2]

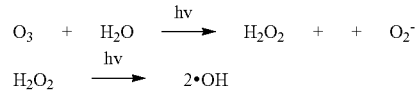

In the case where the solution 900 is irradiated with the ultraviolet light before the solution 900 is ejected from the slit 211, produced radicals may be decomposed by pressure, which is exerted thereon when the solution 900 is ejected. Thus, the solution 900, which is supplied onto the photoresist pattern 820, may have a low radical content, and this may lead to a reduction in removal rate of the photoresist pattern 820. In some embodiments, since the ultraviolet emitter 300 is disposed outside the nozzle 200, the solution 900 may be irradiated with the ultraviolet light, after the ejection of the solution 900 from the slit 211. Thus, the solution 900 having a high radical content may be supplied onto the photoresist pattern 820. Accordingly, it may be possible to increase the removal rate of the photoresist pattern 820.

The light-emitting surface 300b of the ultraviolet emitter 300 may be directed toward the top surface 800a of the substrate 800. The ultraviolet light may be further irradiated onto the solution 900 on the photoresist pattern 820, and thus, radicals may be more quickly produced from the solution 900 on the photoresist pattern 820. Accordingly, it may be possible to increase the removal rate and the process efficiency in the removal process of the photoresist pattern 820.

The ultraviolet emitter 300 may be horizontally moved along with the arm 400, during the irradiation of the ultraviolet light, as shown in FIGS. 1B, 1C, and 5C. Thus, the ultraviolet light may irradiate onto the center and edge regions R1 and R2 of the substrate 800. This may make it possible to reduce a difference in removal rate between the photoresist pattern 820 on the edge region R2 of the substrate 800 and the photoresist pattern 820 on the center region R1 of the substrate 800.

The fluid 700 may be sprayed onto the bottom surface of the substrate 800 to heat the substrate 800 (in S230). The first fluid supplying part 111 may spray the fluid 700 onto a gap region between the top surface 110a of the supporting plate 110 and the bottom surface of the substrate 800, during the removal process of the photoresist pattern 820, as shown in FIG. 5A. An outlet 111Z of the first fluid supplying part 111 may be disposed over the center region of the supporting plate 110. The outlet 111Z of the first fluid supplying part 111 may be extended parallel to a direction that is substantially perpendicular to the top surface 110a of the supporting plate 110. The fluid 700 may be water, such as deionized water. The fluid 700 may be sprayed at a temperature equal to or greater than 65° C. and less than 100° C. The fluid 700 may be in physical contact with the substrate 800. As an example, the fluid 700 sprayed from the first fluid supplying part 111 may be in contact with a bottom surface of a first portion of the substrate 800, and here, the first portion may correspond to the center region R1. Thus, heat energy may be transferred to the photoresist pattern 820 and the solution 900 through the substrate 800. In this case, the process temperature of the removal process of the photoresist pattern 820 may be increased, and this may make it possible to increase an amount of the photoresist pattern 820 to be removed per unit time period. In other words, the removal rate of the photoresist pattern 820 may be increased. If the fluid 700 is sprayed at a temperature lower than 65° C., the removal rate of the photoresist pattern 820 may not be increased sufficiently.

A first gas supplying part 121 may be disposed adjacent to the first fluid supplying part 111. An outlet of the first gas supplying part 121 may be exposed above the top surface 800a of the substrate 800 and may be disposed near the outlet 111Z of the first fluid supplying part 111. The first gas supplying part 121 may spray an inert gas toward the fluid 700, when the fluid 700 is sprayed from the first fluid supplying part 111. The fluid 700 may be prevented from reentering into the first fluid supplying part 111 by the inert gas. In an embodiment, a nitrogen gas may be used as the inert gas.

The second fluid supplying part 113 may spray the fluid 700 into a gap region between the top surface 110a of the supporting plate 110 and the bottom surface of the substrate 800. The fluid 700 may include water, such as deionized water, and may be sprayed at a temperature equal to or greater than 65° C. and less than 100° C. Since the fluid 700 is additionally sprayed from the second fluid supplying part 113, it may be possible to further increase the removal rate of the photoresist pattern 820.

The second fluid supplying part 113 may be spaced apart from the first fluid supplying part 111 and may be closer to the edge region of the supporting plate 110 than the first fluid supplying part 111. An outlet 113Z of the second fluid supplying part 113 may be exposed above the top surface 110a of the supporting plate 110. The outlet 113Z of the second fluid supplying part 113 may be provided to be closer to the edge region of the supporting plate 110 than the outlet 111Z of the first fluid supplying part 111. For example, the smallest distance between the outlet 113Z of the second fluid supplying part 113 and an outer sidewall 110c of the supporting plate 110 may be smaller than the smallest distance between the outlet 111Z of the first fluid supplying part 111 and the outer sidewall 110c of the supporting plate 110.

The outlet 113Z of the second fluid supplying part 113 may be extended in a direction that is inclined at an angle to the top surface 110a of the supporting plate 110. The outlet 113Z of the second fluid supplying part 113 may be tilted to be away from the outlet 111Z of the first fluid supplying part 111 in an upward direction. As an example, the outlet 113Z of the second fluid supplying part 113 may be tilted toward the edge region R2 of the substrate 800 or the edge region of the supporting plate 110. Thus, the second fluid supplying part 113 may bring the fluid 700 into contact with a bottom surface of a second portion of the substrate 800. The second portion may be closer to the side surface of the substrate 800 than the center region R1 of the substrate 800 and may correspond to a region adjacent to the edge region R2 or the edge region R2. The fluid 700 may supply heat energy to the edge region R2 of the substrate 800. The removal rate of the photoresist pattern 820 on the edge region R2 of the substrate 800 may be increased. A plurality of the second fluid supplying parts 113 may be provided to be spaced apart from each other. Thus, the photoresist pattern 820 may be uniformly removed from the substrate 800, without a positional variation. Although not shown, a drain portion may be provided on the outer sidewall 110c of the supporting plate 110 and may discharge the fluid 700, which remains after the reaction. In an embodiment, a single second fluid supplying part 113 may be provided, unlike the illustrated structure. In certain embodiments, the second fluid supplying part 113 may not be provided.

When the fluid 700 is sprayed from the second fluid supplying part 113, a second gas supplying part 123 may spray an inert gas toward the fluid 700. Due to the inert gas, the sprayed fluid 700 may be prevented from reentering into the second fluid supplying parts 113 and may easily flow toward the drain portion. The second gas supplying part 123 and the second fluid supplying part 113 may be provided in pair. For example, the number of the second gas supplying parts 123 may be the same as the number of the second fluid supplying parts 113, and the second gas supplying part 123 may be disposed adjacent to the second fluid supplying part 113.

When the removal of the photoresist pattern 820 (in S300) is finished, a cleaning process may be further performed on the substrate 800. The cleaning process may include supplying distilled water onto the substrate 800 to remove residues and drying the distilled water. The residues may include the remaining solution 900 and a residual material of the removed photoresist pattern 820. The drying of the distilled water may be performed using an inert gas, such as a nitrogen gas. The substrate 800 may rotate at a first revolutions per minute (RPM), during the removal of the photoresist pattern 820 (in S300) described above, and the substrate 800 may rotate at a second RPM, during the drying of the distilled water. The second RPM may be greater than the first RPM. For example, the first RPM may range from 100 rpm to 1000 rpm, and the second RPM may range from 1100 rpm to 2000 rpm.

Thereafter, the substrate 800 may be unloaded from the supporting plate 110 (in S400).

Figure 6A:
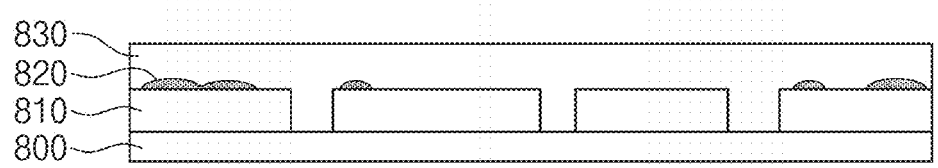
FIG. 6A is a sectional view illustrating an example of a structure, in which an upper layer is formed.

FIG. 6A is a sectional view illustrating an example of a structure, in which an upper layer is formed.

Referring to FIG. 6A, a photoresist removal process may be performed. Unlike the process described above, the solution 900 may be directly ejected through the injection hole 215 of the nozzle 200, during the photoresist removal process. For example, the nozzle 200 may not have the slit 211 and the dispenser room 213. The nozzle 200 may not perform a horizontal motion, and the ultraviolet emitter 300 may be omitted. In this case, the photoresist pattern 820 may be removed at a low rate and in a non-uniform manner depending on a position on the substrate 800. In this case, the photoresist pattern 820 may remain on the edge region R2 of the substrate 800, after the removal process of the photoresist pattern 820. An upper layer 830 may be formed on the lower layer 810 to cover the remained photoresist pattern 820. The photoresist pattern may remain between the upper layer 830 and the lower layer 810. The remained photoresist pattern 820 may serve as an unintended contamination or defect source, during a subsequent process.

Figure 6B:
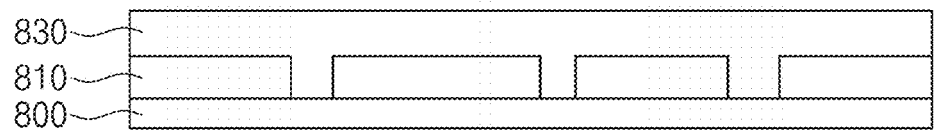
FIG. 6B is a sectional view illustrating a structure including an upper layer, which is formed by a process according to an embodiment of the inventive concepts.

FIG. 6B is a sectional view illustrating a structure including an upper layer, which is formed by a process according to an embodiment of the inventive concepts. The following description of FIGS. 6A and 6B will be partly given based on FIGS. 5A to 5C.

Referring to FIG. 6B, a photoresist removal process may be performed by the method described with reference to FIGS. 5A to 5C. In some embodiments, the photoresist pattern 820 may be quickly removed. The removal rate of the photoresist pattern 820 on the edge region R2 of the substrate 800 may be substantially equal to the removal rate of the photoresist pattern 820 on the center region R1 of the substrate 800. The photoresist pattern 820 may not remain after the photoresist removal process. The upper layer 830 may be formed on the lower layer 810 to cover the lower layer 810. The photoresist pattern 820 may not be interposed between the upper layer 830 and the lower layer 810. The formation of the upper layer 830 may be performed after the unloading of the substrate 800 (in S400) described with reference to FIG. 4. In the fabricating method according to an embodiment of the inventive concepts, it may be possible to fabricate a semiconductor device with a high reliability.

Figure 7:
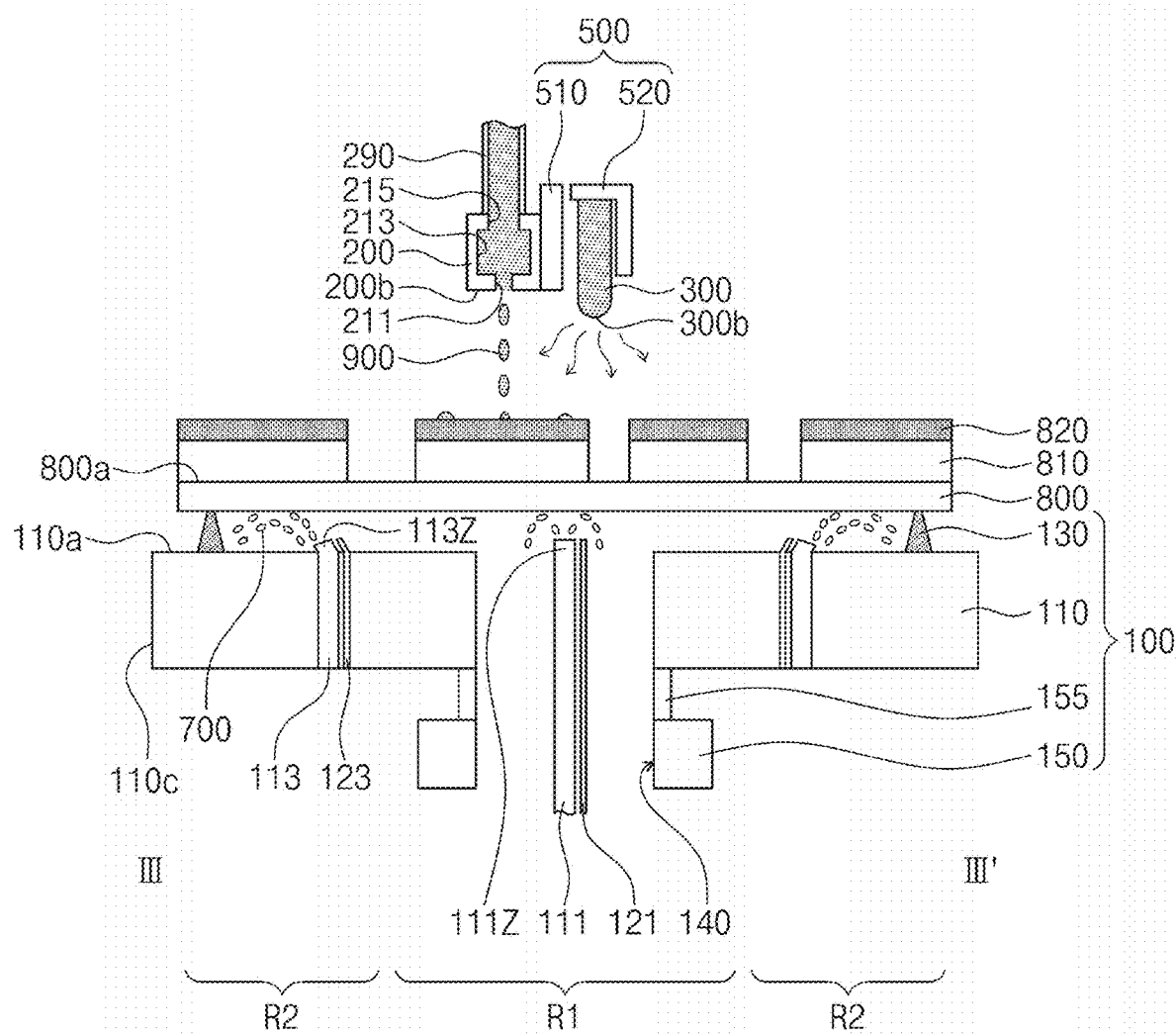
FIG. 7 is a diagram illustrating an apparatus for fabricating a semiconductor device, according to an embodiment of the inventive concepts, and a method of fabricating a semiconductor device using the same.

FIG. 7 is a diagram illustrating a method of fabricating a semiconductor device, according to an embodiment of the inventive concepts.

Referring to FIG. 7, the fabrication apparatus may include the supporting unit 100, the nozzle 200, the ultraviolet emitter 300, and the arm 400. The supporting unit 100, the nozzle 200, the ultraviolet emitter 300, and the arm 400 may be configured to have substantially the same features as those described above. However, the second fluid supplying part 113 may be disposed on the edge region of the supporting plate 110. For example, the second fluid supplying part 113 may be disposed closer to the outer sidewall 110c of the supporting plate 110 than to the center axis of the supporting plate 110, when viewed in a plan view. The second fluid supplying part 113 may be vertically overlapped with the edge region R2 of the substrate 800. The fluid 700 may be sprayed onto a bottom surface of the edge region R2 of the substrate 800 from the outlet 113Z of the second fluid supplying part 113. A plurality of the second fluid supplying parts 113 may be provided. Due to the first fluid supplying part 111 and the second fluid supplying parts 113, the temperature of the center and edge regions R1 and R2 of the substrate 800 may be increased in a uniform manner Thus, the photoresist pattern 820 may be uniformly removed from the substrate 800, without a positional variation.

Figure 8A:
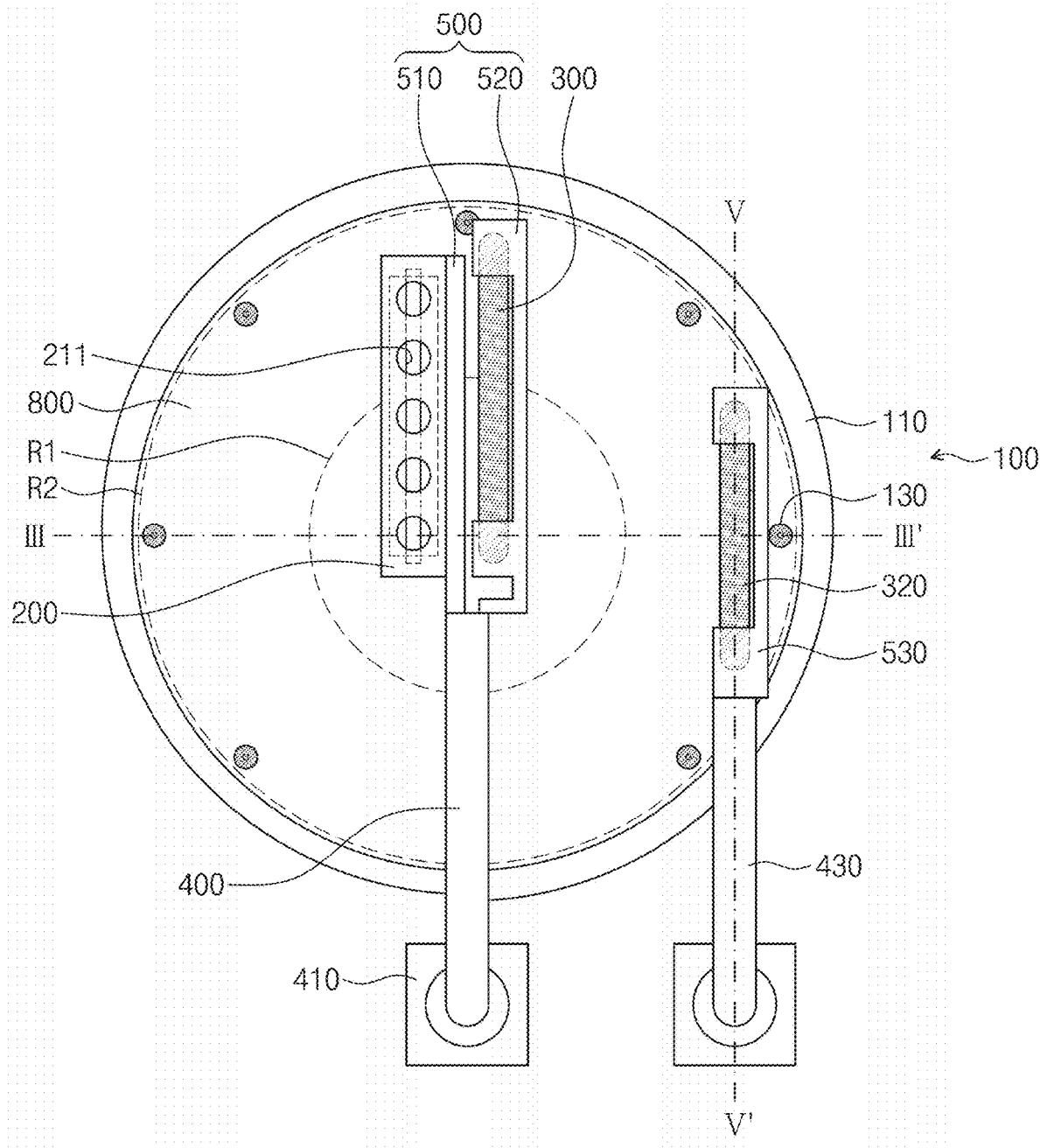
FIG. 8A is a plan view illustrating an apparatus for fabricating a semiconductor device, according to an embodiment of the inventive concepts, and a method of fabricating a semiconductor device using the same.
Figure 8C:
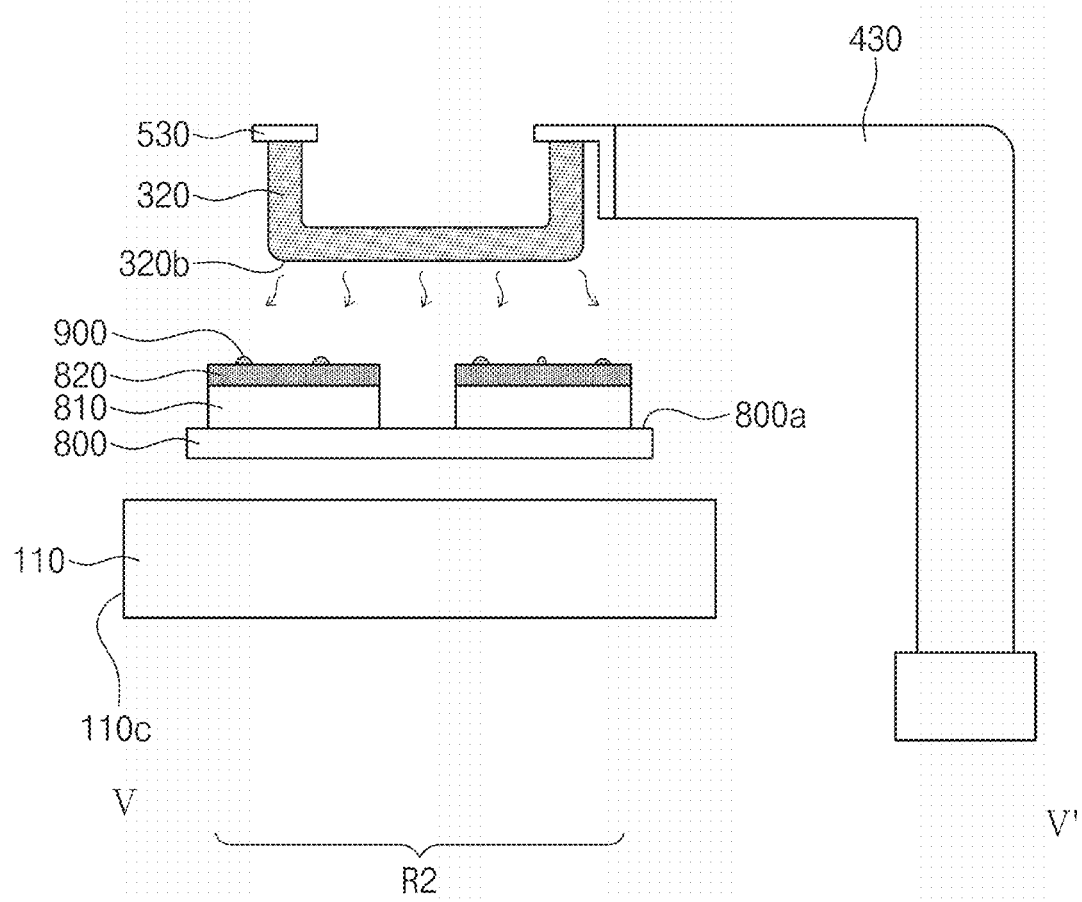
FIG. 8C is a sectional view taken along a line V-V' of FIG. 8A.

FIG. 8A is a plan view illustrating an apparatus for fabricating a semiconductor device, according to an embodiment of the inventive concepts, and a method of fabricating a semiconductor device using the same. FIG. 8B is a sectional view taken along a line of FIG. 8A. FIG. 8C is a sectional view taken along a line V-V' of FIG. 8A.

Referring to FIGS. 4 and 8A to 8C, the fabrication apparatus may include a second ultraviolet emitter 320 and a holding arm 430, in addition to the supporting unit 100, the nozzle 200, the first ultraviolet emitter 300 (hereafter the first ultraviolet emitter), and the arm 400. The holding arm 430 may be spaced apart from the supporting unit 100. At least a portion of the holding arm 430 may be disposed on the top surface 110a of the supporting plate 110 and may be spaced apart from the top surface 110a of the supporting plate 110.

The second ultraviolet emitter 320 may be spaced apart from the nozzle 200, the ultraviolet emitter 300, and the arm 400. The second ultraviolet emitter 320 may be provided on the top surface 110a of the supporting plate 110 and may be spaced apart from the top surface 110a of the supporting plate 110. A connection structure 530 may be provided between the second ultraviolet emitter 320 and the holding arm 430 and may be coupled to the second ultraviolet emitter 320 and the holding arm 430. The second ultraviolet emitter 320 may be connected to the holding arm 430 through the connection structure 530. The connection structure 530 may include, for example, a bracket. The holding arm 430 may provide the second ultraviolet emitter 320 at a fixed position. A light-emitting surface 320b of the second ultraviolet emitter 320 may be a bottom surface of the second ultraviolet emitter 320. The second ultraviolet emitter 320 may irradiate an ultraviolet light onto the edge region R2 of the substrate 800. Since the second ultraviolet emitter 320 is provided, the removal rate of the photoresist pattern 820 on the edge region R2 of the substrate 800 may be further increased. As an example, the second ultraviolet emitter 320 may not be horizontally moved during the removal process of the photoresist pattern 820. The second ultraviolet emitter 320 may include an ultraviolet lamp and may have a "U"-shaped section. The irradiating of the ultraviolet light (in S320) described with reference to FIG. 4 may include irradiating the ultraviolet light using the first ultraviolet emitter 300 and the second ultraviolet emitter 320.

The supporting unit 100, the nozzle 200, the first ultraviolet emitter 300, and the arm 400 may be configured to have substantially the same features as those described above.

According to an embodiment of the inventive concepts, it may be possible to increase an amount of a photoresist pattern to be removed during a unit time period. The photoresist pattern on a substrate may be uniformly removed, without a positional variation.

While example embodiments of the inventive concepts have been particularly shown and described, it will be understood by one of ordinary skill in the art that variations in form and detail may be made therein without departing from the spirit and scope of the attached claims.

What is claimed is:

1. A method of removing a photoresist, comprising:
    ejecting a solution onto the photoresist on a substrate from a slit of a nozzle;
    irradiating ultraviolet light onto the ejected solution using an ultraviolet emitter; and
    spraying a fluid onto a bottom surface of the substrate to heat the substrate;
    wherein the substrate comprises a center region and an edge region surrounding the center region,
    the slit of the nozzle overlaps the center region and the edge region of the substrate.

2. The method of claim 1, further comprising horizontal reciprocating moving the nozzle and the ultraviolet emitter spaced apart on the substrate.

3. The method of claim 1, wherein the solution contains ozone.

4. The method of claim 1, wherein a temperature of the fluid is greater than or equal to 65° C. and less than 100° C.

5. The method of claim 1, wherein a wavelength of the ultraviolet light irradiated from the ultraviolet emitter is greater than or equal to 10 nm and less than 280 nm.

6. The method of claim 1, further comprising rotating the substrate during the irradiated ultraviolet light.

7. The method of claim 1, wherein the fluid sprayed from a first fluid supplying part, and
the first fluid supplying part is located below the center region of the substrate.

8. The method of claim 7, further comprising injecting an inert gas toward the fluid from a first gas supplying part,
wherein the first gas supplying part is located adjacent to the first fluid supplying part.

9. The method of claim 8, wherein the fluid sprayed from a second fluid supplying part, and
the second fluid supplying part is located below the edge region of the substrate.

10. The method of claim 9, wherein the second fluid supplying part is provided in plurality.

11. The method of claim 9, wherein the second fluid supplying part comprises an inclined portion with respect to the bottom surface of the substrate.

12. The method of claim 9, further comprising injecting an inert gas toward the fluid from a second gas supplying part,
wherein the second gas supplying part is located adjacent to the second fluid supplying part.

13. The method of claim 1, further comprising draining the fluid.

14. A method of fabricating a semiconductor device, comprising:
loading a substrate, on which a photoresist pattern is formed, on a supporting plate such that a top surface of the substrate is disposed spaced apart from a nozzle and an ultraviolet emitter; and
removing the photoresist pattern,
wherein the removing of the photoresist pattern comprising:
ejecting a solution onto the photoresist pattern from a slit of the nozzle;
irradiating ultraviolet light onto the ejected solution using the ultraviolet emitter; and
performing a horizontal reciprocating motion with the ultraviolet emitter and the nozzle, and a rotational motion with the supporting plate and the substrate during the irradiating of the ultraviolet light.

15. The method of claim 14, wherein the removing of the photoresist pattern further comprises spraying a fluid onto a bottom surface of the substrate to heat the substrate, and the fluid is in contact with the bottom surface of the substrate.

16. The method of claim 15, wherein the spraying of the fluid further comprises:
spraying the fluid from a first fluid supplying part to bring the fluid in contact with a bottom surface of a center region of the substrate; and
spraying the fluid from a second fluid supplying part to bring the fluid in contact with a bottom surface of an edge region of the substrate,
wherein the edge region of the substrate is closer to a side surface of the substrate than the center region.

17. The method of claim 14, further comprising performing a cleaning process after the removing the photoresist pattern.

18. The method of claim 17, wherein the performing the cleaning process comprises:
removing a residue on the substrate using DI water, and
drying the DI water on the substrate.

19. The method of claim 17, wherein a number of rotations of the substrate is 100 rpm to 1000 rpm during the removing the photoresist pattern, and
a number of rotations of the substrate is 1100 rpm to 2000 rpm during the performing the cleaning process.

* * * * *

UNITED STATES PATENT AND TRADEMARK OFFICE
CERTIFICATE OF CORRECTION

| | |
|---|---|
| PATENT NO. | : 11,742,222 B2 |
| APPLICATION NO. | : 18/057397 |
| DATED | : August 29, 2023 |
| INVENTOR(S) | : Jihun Cheon et al. |

It is certified that error appears in the above-identified patent and that said Letters Patent is hereby corrected as shown below:

On the Title Page

Item (54), and in the Specification Column 1, Lines 1-4:
"APPARATUS FOR REMOVING A PHOTORESIST AND APPARATUS FOR MANUFACTURING A COMICONDUCTOR DEVICE" should be corrected to show
-- APPARATUS FOR REMOVING A PHOTORESIST AND APPARATUS FOR MANUFACTURING A SEMICONDUCTOR DEVICE --

Signed and Sealed this
Twenty-third Day of January, 2024

Katherine Kelly Vidal
*Director of the United States Patent and Trademark Office*